United States Patent
Cheng et al.

(10) Patent No.: US 6,790,778 B1
(45) Date of Patent: Sep. 14, 2004

(54) METHOD FOR CAPPING OVER A COPPER LAYER

(75) Inventors: Yi-Lung Cheng, Taipei (TW); Ying-Lang Wang, Taichung (TW); We-Li Chen, Yunlin (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/658,270

(22) Filed: Sep. 10, 2003

(51) Int. Cl.[7] .............................................. H01L 21/44
(52) U.S. Cl. ....................... 438/687; 438/637; 438/653; 438/652; 438/654; 438/672; 438/677; 438/676; 438/785; 438/902; 438/906
(58) Field of Search ................................ 438/687, 637, 438/653, 652, 654, 672, 677, 676, 785, 902, 906

(56) References Cited

U.S. PATENT DOCUMENTS

| | | | |
|---|---|---|---|
| 6,271,136 B1 * | 8/2001 | Shue et al. ................. | 438/687 |
| 6,297,147 B1 * | 10/2001 | Yang et al. .................. | 438/627 |
| 6,303,505 B1 | 10/2001 | Ngo et al. | |
| 6,323,121 B1 * | 11/2001 | Liu et al. ..................... | 438/633 |
| 6,492,266 B1 | 12/2002 | Ngo et al. | |
| 6,518,167 B1 | 2/2003 | You et al. | |
| 6,642,146 B1 * | 11/2003 | Rozbicki et al. ............ | 438/687 |
| 6,693,030 B1 * | 2/2004 | Subrahmanyan et al. ... | 438/637 |
| 6,700,202 B2 * | 3/2004 | Huang et al. ................ | 257/762 |
| 2002/0187635 A1 * | 12/2002 | Pyo et al. .................... | 438/680 |

* cited by examiner

Primary Examiner—Matthew Smith
Assistant Examiner—Victor V Yevsikov
(74) Attorney, Agent, or Firm—Birch, Stewart, Kolasch & Birch, LLP

(57) ABSTRACT

A method for capping over a copper layer. A copper layer is deposited overlying a substrate. The copper surface is treated with hydrogen-containing plasma to remove copper oxides formed thereon, thereby suppressing copper hillock formation. The treated copper surface is treated again with nitrogen-containing plasma to improve adhesion of the copper surface. A capping layer is formed on the copper layer.

28 Claims, 3 Drawing Sheets

METHOD FOR CAPPING OVER A COPPER LAYER

BACKGROUND OF THE INVENTION

1. Field of the Invention

The present invention relates in general to the use of copper in semiconductor devices. More particularly, it relates to a method for capping over a copper layer to reduce copper hillock formation and improve adhesion of a capping layer to an underlying copper layer.

2. Description of the Related Art:

In the fabrication of semiconductor devices, integrated circuits utilize multilevel wiring structures for interconnecting regions within devices and for interconnecting one or more devices within the integrated circuits. Conventionally, formation of such structures provides, first, lower level wiring lines and then a second level wiring line in contact with the first wiring lines.

Aluminum and aluminum alloys are traditional metal interconnect materials. While such materials have been used as metal interconnects, concern exists as to whether aluminum will meet the demands required by circuit density and higher semiconductor device speeds. Because of these concerns, other materials have been researched for use as interconnects in integrated circuits.

Since copper has a lower resistivity and reduced susceptibility to electromigration failure compared to traditional aluminum or aluminum alloys, it is widely applied to multilevel interconnects in semiconductor devices.

A problem with the use of copper as an interconnect material is that it easily diffuses into surrounding dielectric materials, especially silicon dioxide. In order to inhibit the diffusion, copper interconnects are often capped. An insulating layer, such as silicon nitride, is typically used as a capping layer to cap the top surface of copper interconnects. In general, silicon nitride is formed by plasma enhanced chemical vapor deposition (PECVD). However, in using a silicon nitride cap for copper interconnects, conventional PECVD silicon nitride creates reliability problems. For example, silicon nitride films deposited by PECVD have poor adhesion to copper surfaces. Therefore, when subsequent dielectric layers are deposited onto the silicon nitride film, stress produced therein causes the nitride film to peel from the copper surface and creating a path for copper to diffuse outward and moisture or other contaminants to diffuse inward.

In addition, copper is easily oxidized when exposed to air or oxygen ambient lower than 200° C., thus copper oxide is formed thereon. When a heat treatment, such as annealing, is performed on the copper for subsequent processes, the copper and the overlying copper oxide expand due to heating, but different thermal expansion coefficients of both induce compressive stress at the interface therebetween. In order to release the stress, copper hillocks form on the copper surface, possibly resulting in shorts between neighboring copper interconnects.

It has been suggested to use a copper silicide film on copper interconnects to improve the interface adhesion of copper to silicon nitride. In U.S. Pat. No. 6,303,505, the adhesion problem of capping a silicon nitride layer to a copper interconnect is addressed by treating the exposed copper surface with hydrogen plasma and then reacting the treated surface with silane or dichlorosilane to form a copper silicide layer thereon. Moreover, in U.S. Pat. No. 6,492,266, adhesion problems are addressed by similar method, but ammonia plasma is used. In addition, in U.S. Pat. No. 6,518,167, a metal or metal nitride layer is formed from reaction between a metal organic gas or metal/metal nitride precursor and the copper layer to serve as an adhesion layer between the copper layer and an overlying silicon nitride capping layer.

However, copper silicide exhibits a relatively high resistivity, increasing the resistance of copper interconnects. In addition, neither the copper silicide layer nor metal nitride layer has a suitable thermal coefficient to the underlying copper layer, causing copper hillock growth or formation after heat treatment.

SUMMARY OF THE INVENTION

Accordingly, an object of the present invention is to provide a novel method for capping over a copper layer, which uses two-step plasma treatment to suppress copper hillock formation and enhance adhesion of the copper layer to an overlying capping layer, thereby increasing reliability of the capped copper layer.

According to the object of the invention, a method for capping over a copper layer is provided. First, a copper layer is formed overlying a substrate. Next, a first plasma treatment is performed on a surface of the copper layer. Subsequently, a second plasma treatment is performed on the surface of the copper layer. Finally, the copper layer is capped with an insulating layer.

The first plasma treatment is performed using hydrogen as a reacting gas at about 300 to 500° C., for about 5 to 15 seconds, at a pressure of about 3 to 6 Torr.

The second plasma treatment is performed using ammonia as a reacting gas at about 300 to 500° C., for about 5 to 20 seconds, at a pressure of about 2 to 4 Torr. Moreover, the reacting gas further comprises nitrogen.

Moreover, the insulating layer can be a silicon nitride (SiN) layer, a silicon carbide (SiC) layer, a silicon carbonitride (SiCN) layer, or a silicon oxycarbide (SiCO) layer.

Another aspect of the invention provides a method for forming a copper interconnect. First, a substrate covered by a dielectric layer is provided. Next, the dielectric layer is etched to form an opening therein. Thereafter, the opening is filled with a copper layer to serve as the copper interconnect. Next, a surface of the copper layer is treated with hydrogen-containing plasma. Subsequently, the surface of the copper layer is treated with nitrogen-containing plasma. Finally, a capping layer is formed on the dielectric layer and the copper layer.

The surface of the copper layer is treated with hydrogen-containing plasma at: a temperature of about 300 to 500° C.; a period of time of about 5 seconds to 15 seconds; and at a pressure of about 3 to 6 Torr.

The surface of the copper layer is treated with nitrogen-containing plasma at about 300 to 500° C., for about 5 to 20 seconds, at pressure of about 2 to 4 Torr. Moreover, the reacting gas further comprises nitrogen.

Moreover, the capping layer can be a silicon nitride layer, a silicon carbide layer, a silicon carbonitride layer, or a silicon oxycarbide layer.

DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

Figure 1A:
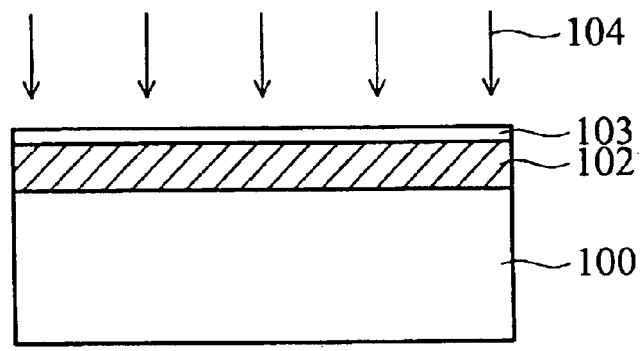
FIGS. 1a to 1c are cross-sections showing a method for capping over a copper layer for semiconductor device fabrication according to the invention.
Figure 1B:
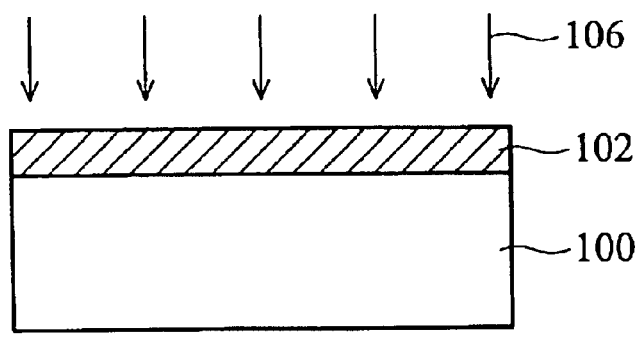
Figure 1C:
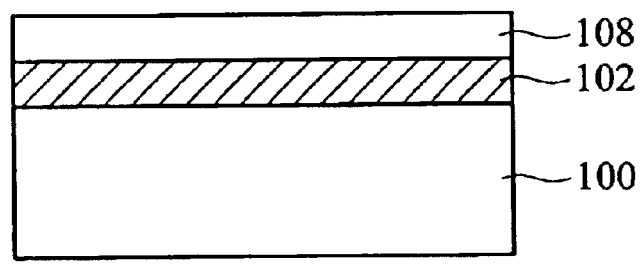

FIGS. 1a to 1c are cross-sections showing a method for capping over a copper layer for semiconductor device fabrication. First, in FIG. 1a, a substrate 100, such as a silicon substrate or other semiconductor substrate, is provided. The substrate 100 may contain a variety of elements, including, for example, transistors, resistors, and other semiconductor elements as are well known in the art. The substrate 100 may also contain other insulating layers or metal interconnect layers. In order to simplify the diagram, a flat substrate is depicted.

Next, a copper layer 102 is formed overlying the substrate 100. The copper layer 102 may be applied by such techniques as chemical vapor deposition (CVD), sputtering, evaporation, electrochemical plating (ECP) and the like.

However, the copper layer 102 is easily oxidized when exposed to air or oxygen ambient lower than 200° C., thus a thin copper oxide layer 103 is formed thereon. When a heat treatment, such as annealing, is performed on the copper layer 102 for subsequent processes, the copper layer 102 and the copper oxide layer 103 expand due to heating, but have a different thermal expansion coefficient, inducing compressive stress at the interface therebetween. Copper hillocks (not shown) form to release the stress and may result in shorts between neighboring copper layers.

In order to suppress copper hillock growth or formation, the thin copper oxide layer 103 must be removed. Accordingly, a plasma treatment 104 is performed on a surface of the copper layer 102 to remove the overlying copper oxide layer 103. In the invention, the plasma treatment 104 is performed using hydrogen ($H_2$) as a reacting gas, at a flow rate of about 300 to 600 sccm. Moreover, the treatment 104 with hydrogen-containing plasma is performed at an RF power of about 150 to 300 watts, at about 300 to 500° C., at a pressure of about 3 to 6 Torr, for about 5 to 15, and preferably 10, seconds.

Although removing the copper oxide layer 103 can avoid copper hillock formation, adhesion of the copper layer 102 to an overlying capping layer formed in subsequent process for copper diffusion prevention is still very poor. As a result, the capping layer peels from the copper layer 102, causing a path for copper to diffuse outward and moisture or other contaminants to diffuse inward. Accordingly, after the copper oxide layer 103 overlying the copper layer 102 is removed, another plasma treatment 106 is performed on the treated surface of the copper layer 102 again, as shown in FIG. 1b.

In the invention, the plasma treatment 106 is performed using ammonia ($NH_3$) as a reacting gas, at a flow rate of about 50 to 100 sccm. In addition, the reacting gas can optionally have nitrogen ($N_2$) added at a flow rate of about 2000 to 4000 sccm. Moreover, the treatment 106 with nitrogen-containing plasma is performed at an RF power of about 150 to 300 watts, at about 300 to 500° C., at a pressure of about 2 to 4 Torr, for about 5 to 20, and preferably 10 seconds.

Finally, in FIG. 1c, a capping layer 108 is formed on the copper layer 102 to prevent copper diffusion and serve as a protective layer for subsequent deposition and etching. Here, the capping layer 108 can be a silicon nitride (SiN) layer, a silicon carbide (SiC) layer, a silicon carbonitride (SiCN) layer, or a silicon oxycarbide (SiCO) layer formed by conventional deposition, such as CVD. Since Cu—N bonding (not shown) is formed on the surface of the copper layer 102 after nitrogen-containing plasma treatment 106, adhesion of the copper layer 102 to the overlying capping layer 108 can be effectively improved, thereby preventing current leakage and copper diffusion.

FIGS. 2a to 2e are cross-sections showing a method for forming a copper interconnect for semiconductor device fabrication. First, in FIG. 2a, a substrate 200, such as a silicon substrate or other semiconductor substrate, is provided. Also, the substrate 200 may contain a variety of elements, including, for example, transistors, resistors, and other semiconductor elements as are well known in the art. The substrate 200 may also contain other insulating layers or metal wiring layers. In order to simplify the diagram, a flat substrate is depicted.

Next, a dielectric layer 202 is deposited overlying the substrate 200. In the invention, the dielectric layer 202 serves as an ILD layer or an IMD layer. For example, the dielectric layer 202 may be silicon dioxide, PSG, BPSG, or low-k material, such as FSG. Moreover, the dielectric layer 202 can be formed by conventional deposition, such as PECVD, LPCVD, APCVD, HDPCVD or other suitable CVD. In addition, an anti-reflective layer (not shown) can be optionally deposited overlying the dielectric layer 202. The anti-reflective layer may be SiON formed by CVD using, for example, $SiH_4$, $O_2$, and $N_2$ as process gases.

Thereafter, lithography and etching, such as RIE, are successively performed on the dielectric layer 202 to form openings 203 and 204 therein. The openings 203 and 204 can be a single or dual damascene opening. In the invention, for example, the opening 203 is a single damascene opening and the opening 204 is a dual damascene opening.

Figure 2A:
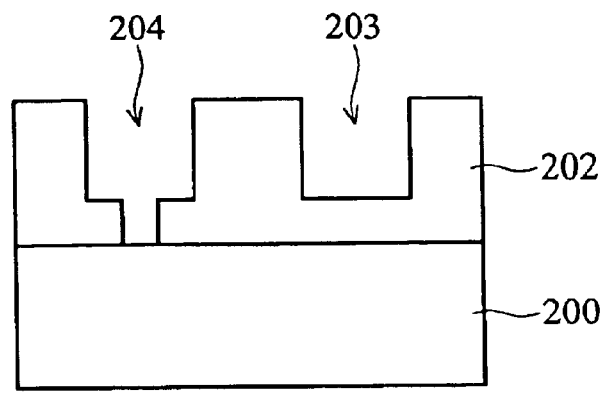
FIGS. 2a to 2e are cross-sections showing a method for forming a copper interconnect for semiconductor device fabrication according to the invention.
Figure 2B:
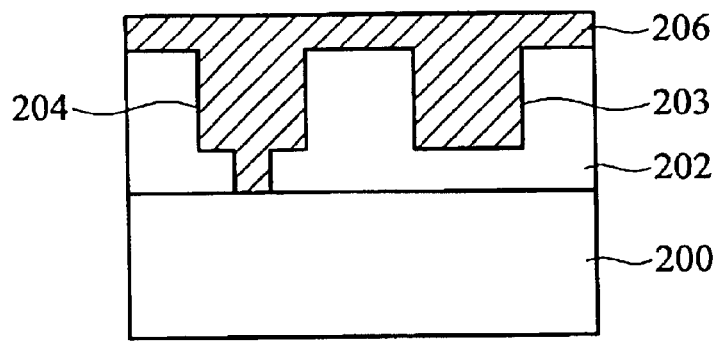

Next, in FIG. 2b, a copper layer 202 is formed overlying the dielectric layer 202 and fills in the openings 203 and 204. The copper layer 206 may be applied by such techniques as CVD, sputtering, evaporation, ECD and the like.

Figure 2C:
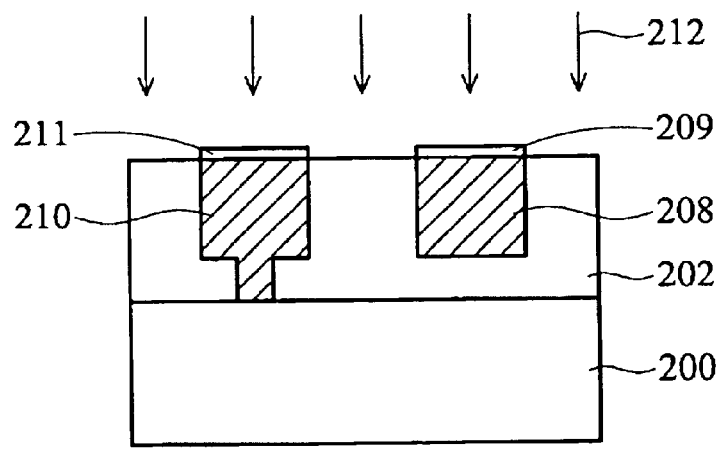

Next, in FIG. 2c, the excess copper layer 206 on the dielectric layer 202 is removed by an etch back process or polishing, such as chemical mechanic polishing (CMP). The remaining copper layer 208 in the opening 203 and the remaining copper layer 210 in the opening 210 serve as interconnects for the semiconductor device. However, the remaining copper layers 208 and 210 are easily oxidized when exposed to oxygen ambient lower than 200° C. or react with slurry during CMP, such that thin copper oxide layers 209 and 211 are respectively formed on the remaining copper layers 208 and 210. When a heat treatment, such as annealing, is performed for subsequent processes, copper hillocks (not shown) form and may result in shorts between copper interconnects 208 and 210.

In order to suppress copper hillock growth or formation, the thin copper oxide layers 209 and 211 must be removed. Therefore, a plasma treatment 212 is performed on a surface of the copper layers 208 and 210 to remove the overlying copper oxide layers 209 and 211. In the invention, the plasma treatment 212 is performed using $H_2$ as a reacting gas, at a flow rate of about 300 to 600 sccm. Moreover, the treatment 212 with hydrogen-containing plasma is performed at an RF power of about 150 to 300 watts, at about 300 to 500° C., at a pressure of about 3 to 6 Torr, for about 5 to 15, and preferably 10, seconds.

Figure 2D:
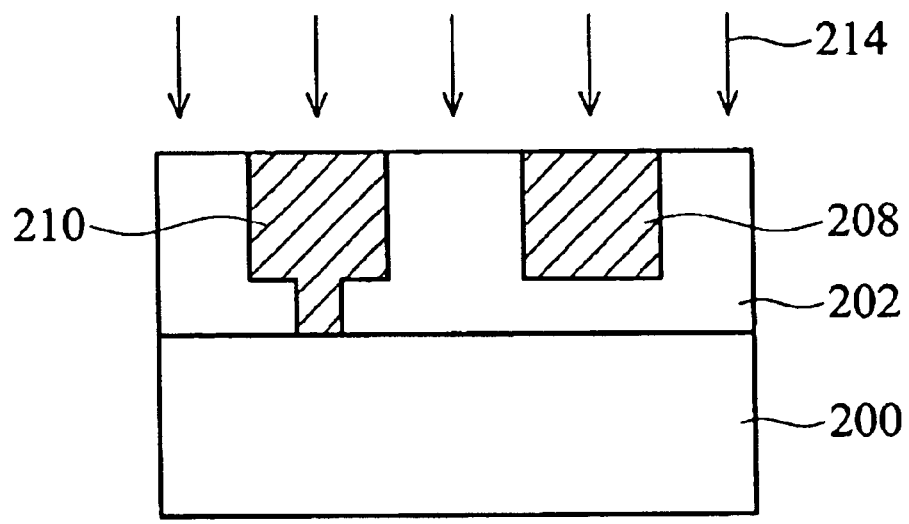

Copper oxide layers 209 and 211 are also removed to avoid copper hillock formation, however, adhesion of the copper layers 208 and 210 to an overlying capping layer formed in subsequent process for copper diffusion prevention is still very poor. As a result, the capping layer peels from the copper layers 208 and 210, causing a path for copper to diffuse outward and moisture or other contaminants to diffuse inward. Accordingly, after removing the copper oxide layers 209 and 211 overlying the copper layers 208 and 210, another plasma treatment 214 is performed on the treated surface of the copper layers 208 and 210 again, as shown in FIG. 2d.

In the invention, the plasma treatment 214 is performed using $NH_3$ as a reacting gas, at a flow rate of about 50 to 100 sccm. In addition, the reacting gas can optionally have $N_2$ added at a flow rate of about 2000 to 4000 sccm. Moreover, the treatment 214 with nitrogen-containing plasma is performed at an RF power of about 150 to 300 watts, at about 300 to 500° C., at a pressure of about 2 to 4 Torr, for about 5 to 20, and preferably 10, seconds.

Figure 2E:
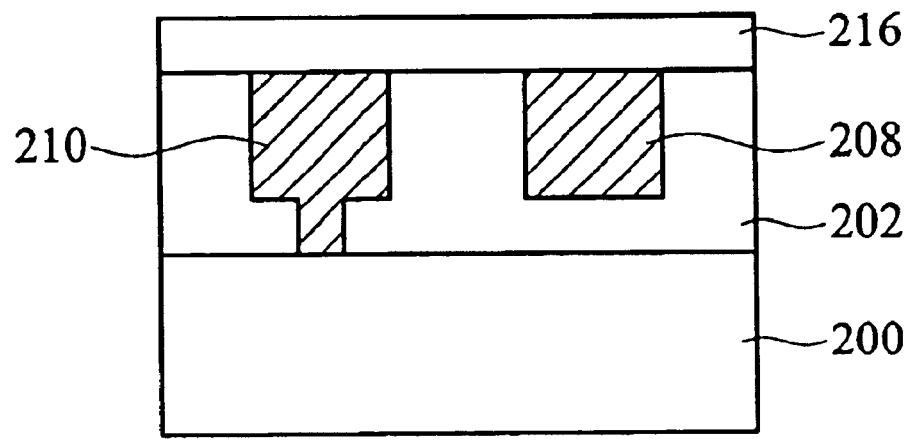

Finally, in FIG. 2e, a capping layer 216 is formed on the dielectric layer 202 and on the copper layers 208 and 210 to prevent copper diffusion and serve as a protective layer for subsequent deposition and etching. Here, the capping layer 216 can be a silicon nitride layer, a silicon carbide layer, a silicon carbonitride layer, or a silicon oxycarbide layer formed by conventional deposition, such as CVD. As mentioned above, since Cu—N bonding (not shown) is formed on the surface of the copper layers 208 and 210 after nitrogen-containing plasma treatment 214, adhesion of the copper layers 208 and 210 to the overlying capping layer 216 can be effectively improved to prevent current leakage and copper diffusion.

According to the invention, copper hillock growth or formation can be prevented by surface treatment with hydrogen-containing plasma to improve the quality of the interface between the capping layer and the copper layer. Moreover, adhesion of the copper layer to the capping layer can be enhanced by surface treatment with nitrogen-containing plasma, thereby improving electromigration reliability and semiconductor device performance.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for capping over a copper layer, comprising the steps of:
   forming the copper layer overlying a substrate;
   performing a first plasma treatment on a surface of the copper layer;
   performing a second plasma treatment on the surface of the copper layer; and
   capping the copper layer with an insulating layer.

2. The method as claimed in claim 1, wherein the first plasma treatment is performed using hydrogen as a reacting gas.

3. The method as claimed in claim 2, wherein the first plasma treatment is performed at about 300 to 500° C.

4. The method as claimed in claim 2, wherein the first plasma treatment is performed for about 5 to 15 seconds.

5. The method as claimed in claim 2, wherein the first plasma treatment is performed at a pressure of about 3 to 6 Torr.

6. The method as claimed in claim 1, wherein the second plasma treatment is performed using ammonia as a reacting gas.

7. The method as claimed in claim 6, wherein the reacting gas further comprises nitrogen.

8. The method as claimed in claim 6, wherein the second plasma treatment is performed at about 300 to 500° C.

9. The method as claimed in claim 6, wherein the second plasma treatment is performed for about 5 to 20 seconds.

10. The method as claimed in claim 6, wherein the second plasma treatment is performed at a pressure of about 2 to 4 Torr.

11. The method as claimed in claim 1, wherein the insulating layer comprises a silicon nitride layer, a silicon carbide layer, a silicon carbonitride layer, or a silicon oxycarbide layer.

12. A method for capping over a copper layer, comprising the steps of:
   forming the copper layer overlying a substrate;
   treating a surface of the copper layer with a hydrogen-containing plasma;
   treating the surface of the copper layer with a nitrogen-containing plasma; and
   capping the copper layer with an insulating layer.

13. The method as claimed in claim 12, wherein the surface of the copper layer is treated with the hydrogen-containing plasma at about 300 to 500° C.

14. The method as claimed in claim 12, wherein the surface of the copper layer is treated with the hydrogen-containing plasma for about 5 to 15 seconds.

15. The method as claimed in claim 12, wherein the surface of the copper layer is treated with the hydrogen-containing plasma at a pressure of about 3 to 6 Torr.

16. The method as claimed in claim 12, wherein the surface of the copper layer is treated with the nitrogen-containing plasma at about 300 to 500° C.

17. The method as claimed in claim 12, wherein the surface of the copper layer is treated with the nitrogen-containing plasma for about 5 to 20 seconds.

18. The method as claimed in claim 12, wherein the surface of the copper layer is treated with the nitrogen-containing plasma at a pressure of about 2 to 4 Torr.

19. The method as claimed in claim 12, wherein the insulating layer comprises a silicon nitride layer, a silicon carbide layer, a silicon carbonitride layer, or a silicon oxycarbide layer.

20. A method for forming a copper interconnect, comprising the steps of:
   providing a substrate covered by a dielectric layer;
   etching the dielectric layer to form an opening therein;
   filling the opening with a copper layer to serve as the copper interconnect;
   treating a surface of the copper layer with a hydrogen-containing plasma;
   treating the surface of the copper layer with a nitrogen-containing plasma; and
   forming a capping layer on the dielectric layer and the copper layer.

21. The method as claimed in claim 20, wherein the opening is a dual damascene opening.

22. The method as claimed in claim 20, wherein the surface of the copper layer is treated with the hydrogen-containing plasma at about 300 to 500° C.

23. The method as claimed in claim 20, wherein the surface of the copper layer is treated with the hydrogen-containing plasma for about 5 to 15 seconds.

24. The method as claimed in claim 20, wherein the surface of the copper layer is treated with the hydrogen-containing plasma at a pressure of about 3 to 6 Torr.

25. The method as claimed in claim 20, wherein the surface of the copper layer is treated with the nitrogen-containing plasma at about 300 to 500° C.

26. The method as claimed in claim 20, wherein the surface of the copper layer is treated with the nitrogen-containing plasma for about 5 to 20 seconds.

27. The method as claimed in claim 20, wherein the surface of the copper layer is treated with the nitrogen-containing plasma at a pressure of about 2 to 4 Torr.

28. The method as claimed in claim 20, wherein the insulating layer comprises a silicon nitride layer, a silicon carbide layer, a silicon carbonitride layer, or a silicon oxycarbide layer.

\* \* \* \* \*